US005194700A

United States Patent [19]

Lin

[11] Patent Number: 5,194,700

[45] Date of Patent: Mar. 16, 1993

[54] LOUVER STRUCTURE WITH MOVABLE SLATS FOR A LOUDSPEAKER BOX

[76] Inventor: Jen-Hung Lin, No. 69, Ta Tung Rd, San shan Jen, Taipei Hsien, Taiwan

[21] Appl. No.: 762,890

[22] Filed: Sep. 19, 1991

[51] Int. Cl.[5] .............................................. H05K 5/00
[52] U.S. Cl. .................................... 181/155; 181/199
[58] Field of Search ............... 181/148, 149, 150, 151, 181/152, 153, 154, 155, 191, 199

[56] References Cited

U.S. PATENT DOCUMENTS 2,623,606 12/1952 Corke ................................. 181/155
3,679,023 7/1972 Rankin ............................... 181/155
4,624,337 11/1986 Shavers ........................... 181/199 X

*Primary Examiner*—Michael L. Gellner
*Assistant Examiner*—Khanh Dang
*Attorney, Agent, or Firm*—Yuso International Patent and Trademark Office

[57] ABSTRACT

A loudspeaker cabinet has an annular frame mounted on its front face to support a multiplicity of louvers that are coupled together by a transversely extending coupling arm. The louvers can be opened when the loudspeaker is operating. When the loudspeaker is not in operation the louvers can be closed to protect the speaker against dust accumulations. The louver coupling arm is located in cut outs formed in the louver rear edges so that the arm is relatively inconspicuous.

3 Claims, 4 Drawing Sheets

LOUVER STRUCTURE WITH MOVABLE SLATS FOR A LOUDSPEAKER BOX

BACKGROUND OF THE INVENTION

Generally, a loudspeaker is fixedly mounted in a box having a given dimension for convenient mounting of the speaker and improved speaker performance. When the cone part of a speaker moves outwards, the air before the speaker, part will be compressed, while the air behind the cone part will become slightly decompressed. If there is no box to house the speaker the cone part of the speaker will experience acoustic interference because of different phase relation; therefore, a speaker box is an essential part in an audio system.

Generally, a loudspeaker is exposed to the air; therefore, the loudspeaker is susceptible to dust, dirt and damage, as well as unattractive appearance.

SUMMARY OF THE INVENTION

This invention relates to a louver structure with movable slats for a loudspeaker box, comprising a frame, a coupling arm and a plurality of slats. Both ends of each of the slats have pivots respectively to be mated pivotally with two round holes on the upper and lower members of the frame. All the slats are coupled together by means of a coupling arm so as to have all slats move upon one slat being pushed; therefore, the slats can be set in an open or closed position, or at various intermediate positions.

The prime feature of the present invention is to provide a louver structure with movable slats for a loudspeaker box so as to protect the loudspeaker with the slats.

Another feature of the present invention is to provide a louver structure with movable slats for a loudspeaker box in order to prevent the speaker from being polluted by dust by closing the slats when not in use.

Still another feature of the present invention is to provide a louver structure with movable slats for a loudspeaker box; the louver structure is to be mounted on front side of a speaker box for improved overall appearance.

DETAILED DESCRIPTION

Figure 1:
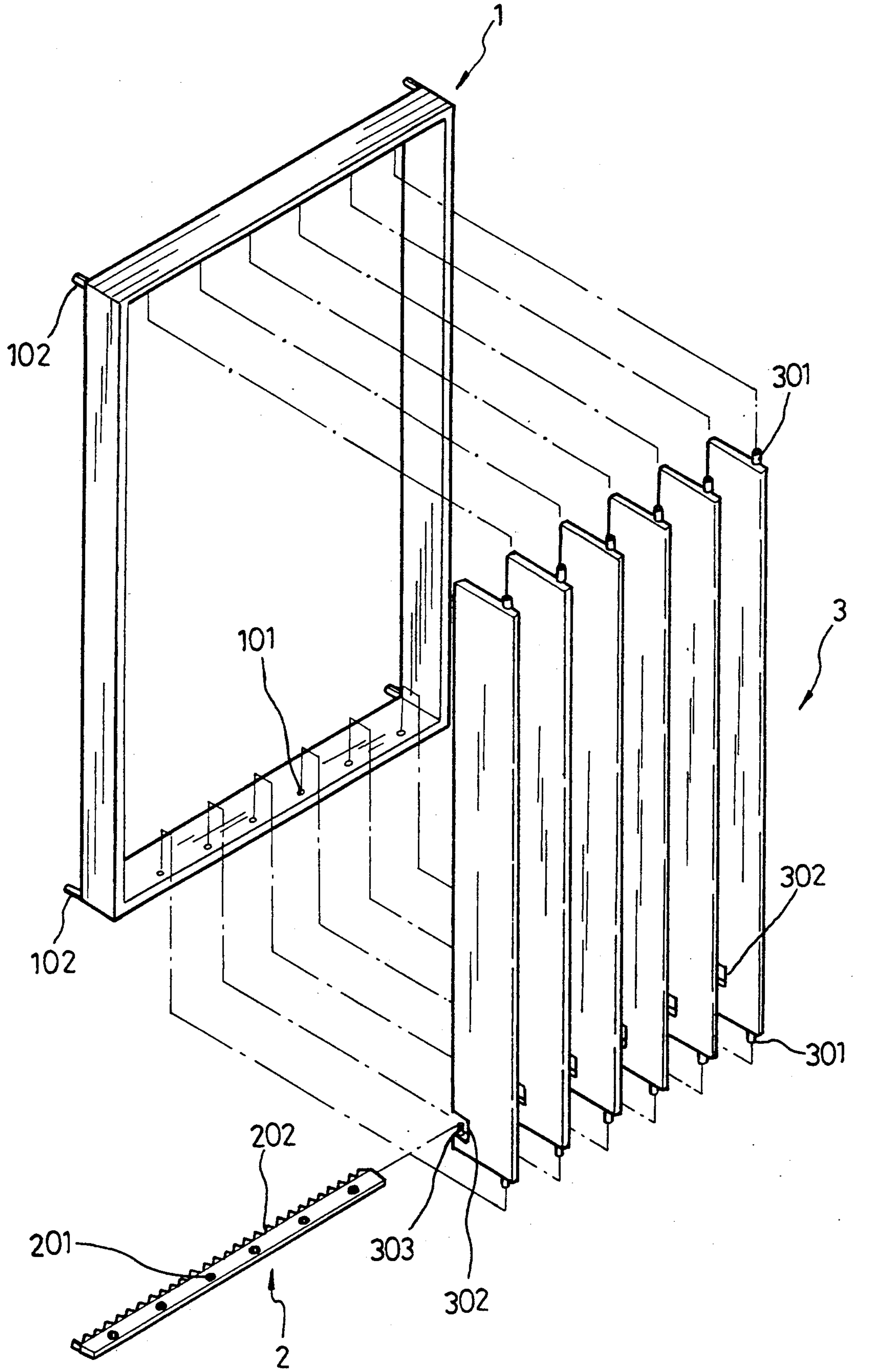
FIG. 1 is a disassembled view of an embodiment according to the present invention.
Figure 2:
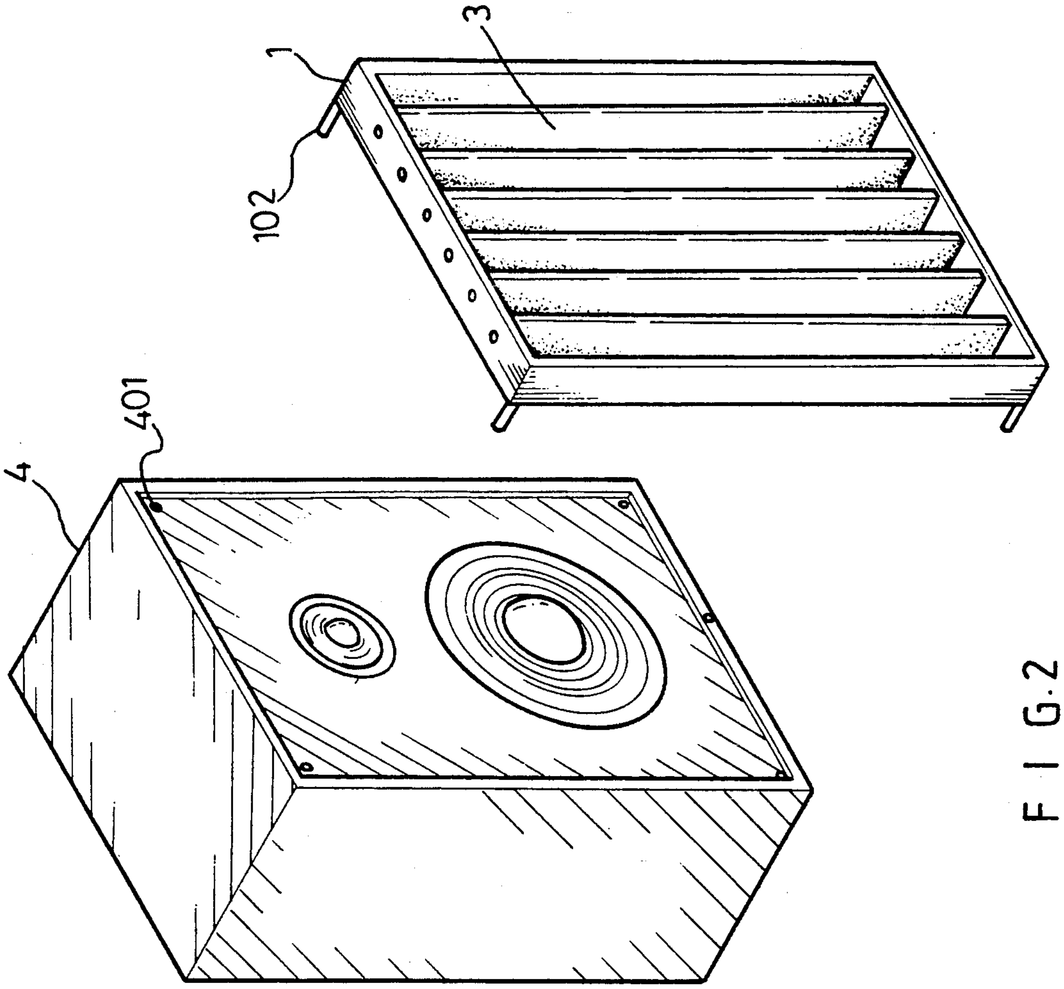
FIG. 2 is a perspective view, showing the embodiment according to the present invention to be mounted on a loudspeaker box.
Figure 4:
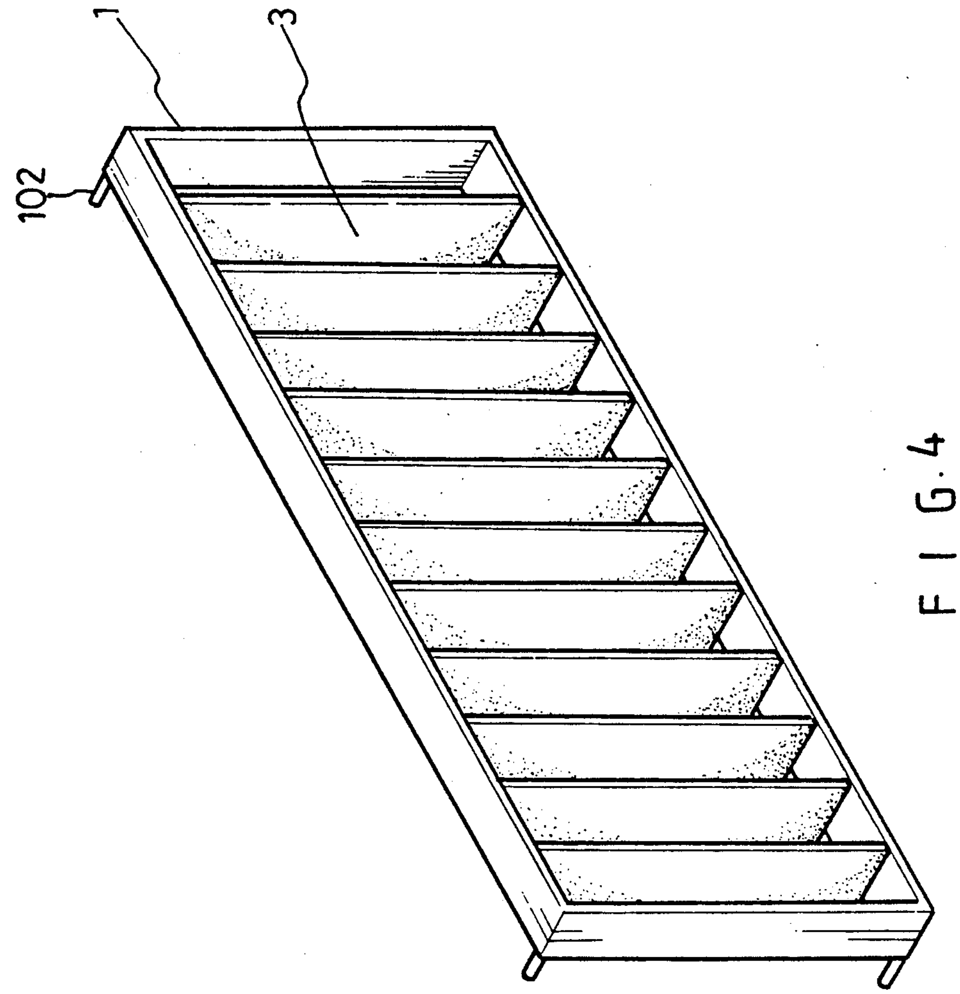
FIGS. 3 and 4 illustrate other embodiments according to the present invention.
Figure 3:
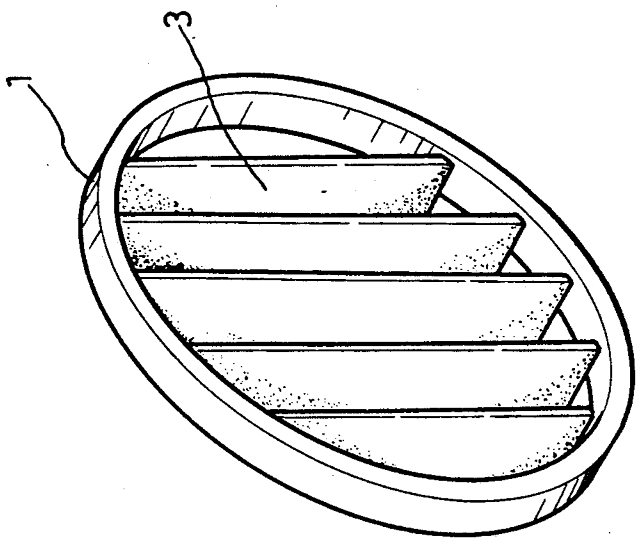

Referring to FIG. 1, the present invention comprises a frame 1, a coupling arm 2, and a plurality of slats louvers 3. The frame 1 is a vertically rectangular member, of which the upper and lower frame portions are provided with a plurality of round louver support holes 101 respectively. The rear side of the frame 1 is furnished with a plurality with pins 102. The coupling arm 2 is an essentially flat arm with a plurality of round openings 201 and a rack member on its rear edge. Both ends of each of the slats 3 have pivots 301 respectively. Near its lower end each louver 3 has a cut 302 and an upwardly projecting stud 303. The pivots 301 on both ends of the each slat 3 are to be mated with round holes 101 on the frame 1 so as to mount slats 3 vertically in the frame; then, the round openings 201 on the coupling arm 2 are mated with the studs 303 thereof respectively, and when one of the slats 3 is actuated, the other slats 3 will be moved synchronously. The frame 1 is to be attached to a loudspeaker cabinet 4 by means of pins 102 on the frame and the round holes 401 on the cabinet 4 as shown in FIG. 2. After the frame 1 with slats 3 is attached to the front of the loudspeaker cabinet 4, the loudspeaker can be protected by moving the slats 3 freely to prevent dust from entering the loudspeaker. Furthermore, the frame 1 may also be a round shape or a horizontally rectangular shape (as shown in FIGS. 3 and 4), or other shapes so as to fit different shapes of loudspeaker boxes, such as that used in a car.

Figure 5:
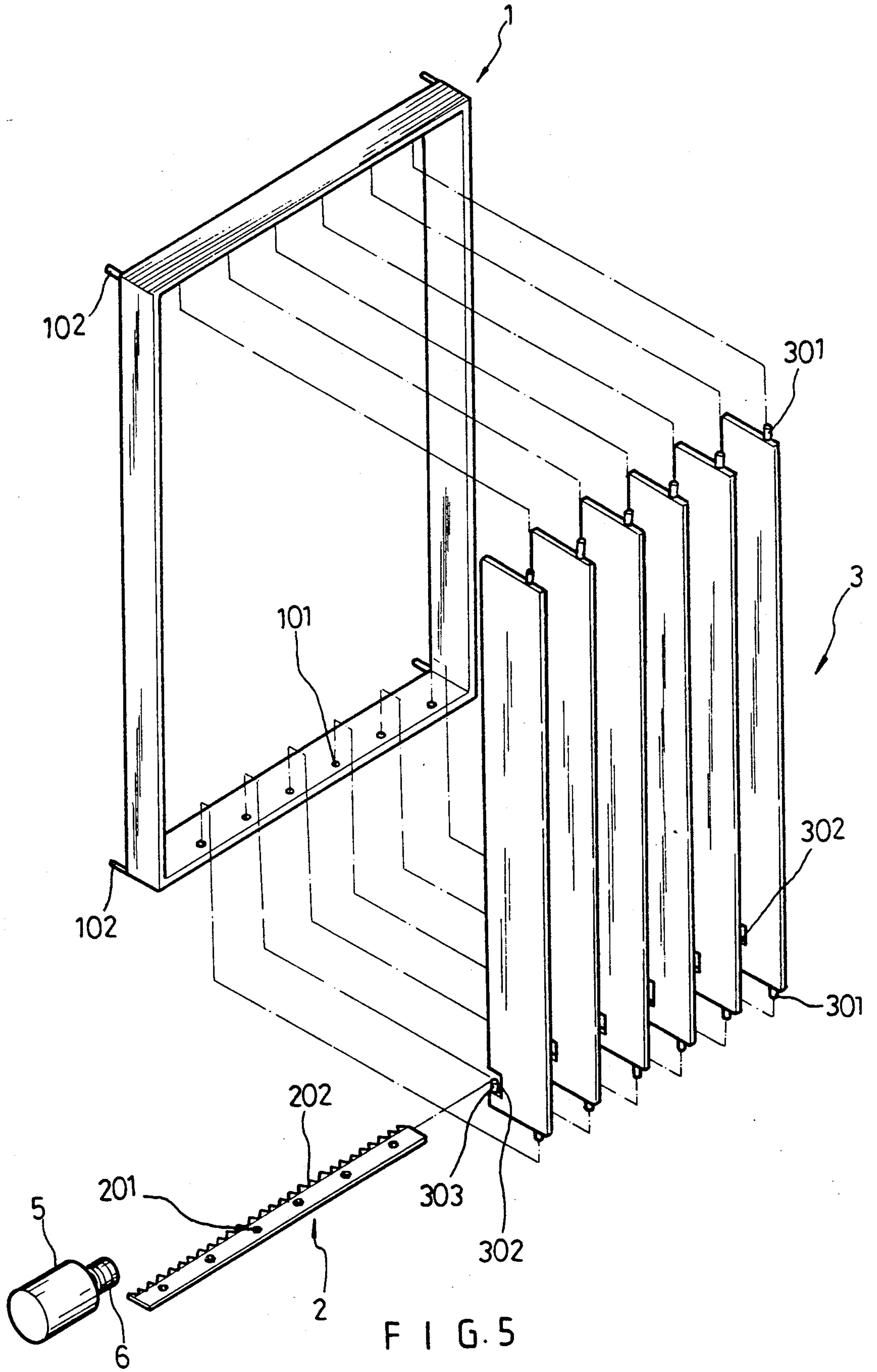
FIG. 5 is a disassembled view of another embodiment of the present invention to be driven with a motor.

Referring to FIG. 5, it shows that the slats 3 of the present invention are arranged to be driven by a motor, 5 which has a worm shaft 6 in mesh with gear teeth on coupling arm 2. The motor can be driven to move by means of a remote control means, such as an electronic circuit.

I claim:

1. A loudspeaker cabinet having a front face through which sounds are broadcast; an annular frame secured to the cabinet front face, said frame having two opposed spaced-apart louver support walls and two connector walls extending therebetween; each louver support wall having a plurality of round holes spaced therealong; a plural number of louvers extending between said louver support walls; each louver having end edges thereof located in near proximity to the associated support walls, and pivot pins extending from said louver end edges into said round holes, whereby said louvers are pivotably mounted within said annular frame; each louver having a front edge facing away from the loudspeaker cabinet, and a rear edge presented toward the cabinet; each louver having a cut out in its rear edge, the cut outs in said louvers being aligned to form a free space extending transversely through the louvers; a stud located within each cut out; and a louver coupling arm having openings spaced therealong; said louver coupling arm being located within the free space defined by the cut outs, with the openings in said arm fitting on the studs so that the arm forms a connecting link between the louvers.

2. The combination of claim 1, wherein said annular frame has a rectangular configuration having the same peripheral dimensions as the cabinet front face, whereby the frame forms a frontal continuation of the cabinet.

3. The combination of claim 1, and further comprising an electric motor attachable to said frame; said motor having a drive shaft that includes a helical worm gear; said coupling arm having gear teeth in mesh with said worm gear, whereby rotation of the motor moves the coupling arm for thereby pivotably moving the louvers.

* * * * *